US006758915B2

(12) United States Patent
Takashima et al.

(10) Patent No.: US 6,758,915 B2
(45) Date of Patent: Jul. 6, 2004

(54) GRAIN ORIENTED ELECTROMAGNETIC STEEL SHEET EXHIBITING EXTREMELY SMALL WATT LOSS AND METHOD FOR PRODUCING THE SAME

(75) Inventors: Minoru Takashima, Kurashiki (JP); Mineo Muraki, Chiba (JP); Hiroi Yamaguchi, Kurashiki (JP); Mitsumasa Kurosawa, Kurashiki (JP); Michiro Komatsubara, Kurashiki (JP)

(73) Assignee: JFE Steel Corporation (JP)

( * ) Notice: Subject to any disclaimer, the term of this patent is extended or adjusted under 35 U.S.C. 154(b) by 0 days.

(21) Appl. No.: 10/297,423

(22) PCT Filed: Apr. 5, 2001

(86) PCT No.: PCT/JP01/02943

§ 371 (c)(1),
(2), (4) Date: Dec. 5, 2002

(87) PCT Pub. No.: WO02/081765

PCT Pub. Date: Oct. 17, 2002

(65) Prior Publication Data

US 2003/0136470 A1 Jul. 24, 2003

(51) Int. Cl.$^7$ .............................................. H01F 1/04
(52) U.S. Cl. ..................... 148/113; 148/306; 148/307; 148/308; 148/120; 148/121; 148/122; 427/127; 427/567
(58) Field of Search ............. 148/110–113, 120–122, 148/306, 307, 308; 427/127, 255.29–255.38, 255.393, 255.394, 446, 564, 569, 567, 576, 585

(56) References Cited

U.S. PATENT DOCUMENTS

| 3,932,236 A | * | 1/1976 | Wada et al. ................. 148/113 |
| 4,645,547 A | * | 2/1987 | Krause et al. .............. 148/111 |
| 4,698,272 A | * | 10/1987 | Inokuti et al. .............. 428/627 |
| 4,713,123 A | * | 12/1987 | Inokuti et al. .............. 148/113 |
| 5,013,374 A | * | 5/1991 | Block et al. ................. 148/113 |
| 5,961,744 A | * | 10/1999 | Yamazaki et al. .......... 148/113 |
| 6,280,862 B1 | * | 8/2001 | Inokuti ........................ 428/698 |

FOREIGN PATENT DOCUMENTS

| JP | 60-255926 | * 12/1985 | .................. 148/113 |
| JP | 3-294467 | * 12/1991 | .................. 427/576 |
| JP | 10-245667 | 9/1998 | |
| JP | 2001-107146 | 4/2001 | |

* cited by examiner

Primary Examiner—John P. Sheehan
(74) Attorney, Agent, or Firm—Piper Rudnick LLP

(57) ABSTRACT

The invention is a grain-oriented magnetic steel sheet having extremely low iron loss, suitable for use as an iron core material for transformers and power generators, and a method for producing the same. The method includes forming a coating layer on a surface of a steel sheet having a thickness of 0.27 mm or less by vapor deposition in a low oxidizing atmosphere with an oxygen partial pressure ($P_{O_2}$) of less than 0.1 atm and a total pressure of 0.1 atm or more. The steel sheet has extremely low iron loss with a thickness of 0.27 mm or less and includes a coating layer formed by vapor deposition on a matrix surface.

18 Claims, 2 Drawing Sheets

GRAIN ORIENTED ELECTROMAGNETIC STEEL SHEET EXHIBITING EXTREMELY SMALL WATT LOSS AND METHOD FOR PRODUCING THE SAME

TECHNICAL FIELD

The present invention relates to grain-oriented magnetic steel sheets having extremely low iron loss which are suitable for use as iron core materials for transformers and power generators, and to methods for producing the same.

BACKGROUND ART

It is well known that grain-oriented magnetic steel sheets which contain Si and whose crystal orientations are (110) [001] and (100) [001] have excellent soft magnetic properties. Therefore, they are widely used as iron core materials for various types of electrical apparatuses used in the commercial frequency band. In general, in such a grain-oriented magnetic steel sheet, the iron loss ($W_{17/50}$), which is observed when magnetized at 1.7 T at a frequency of 50 Hz, must be low.

Core loss consists of eddy current loss and hysteresis loss. Various methods are known in order to effectively decrease eddy current loss. Examples thereof include a method of increasing electrical resistance by adding Si, a method of decreasing steel sheet thickness, and a method of decreasing grain size. On the other hand, in order to effectively decrease hysteresis loss, a method of aligning crystal orientation is known.

However, the method of increasing electrical resistance by adding Si has limitations. This is because the saturation magnetic flux density decreases if an excessively large amount of Si is added. The decrease in the saturation magnetic flux density results in an increase in the size of iron cores, which is undesirable.

The method of decreasing steel sheet thickness also has limitations. This is because the rolling loads greatly increase, resulting in an extreme increase in manufacturing costs.

With respect to the method of aligning crystal orientation, products which have a magnetic flux density ($B_8$) that is close to the saturation value, such as 1.96 T or 1.97 T, have already been obtained. Therefore, there is little room for a further decrease in hysteresis loss.

Recently, techniques for reducing iron loss by artificially decreasing magnetic domain widths have been developed. Examples thereof include a method of locally introducing strain by applying plasma jet or laser beams to the surfaces of steel sheets and a method in which grooves are formed in the surfaces of steel sheets. Although a considerable iron loss reduction effect has been achieved by such magnetic domain-refining techniques, the effect has also reached its limit.

As the other techniques for reducing iron loss, methods related to the surface properties of magnetic steel sheets have also been disclosed.

Japanese Examined Patent Application Publication No. 52-24499 discloses a method in which the roughness at the interface between a metal surface of a steel sheet and a surface of a non-metallic coating film is decreased. Japanese Examined Patent Application Publication Nos. 7-9041, 5-87597, and 6-37694 disclose methods of performing so-called "crystal orientation-intensifying treatment" in which crystals with specific crystal orientations are left on metal surfaces.

In order to reduce iron loss by such methods, strong tension must be applied to a steel sheet. Therefore, it was required to form a tensile coating film on the surface of the steel sheet. If no tensile coating film was provided, since the surface of the steel sheet was smooth, an increase in magnetic domain width was accelerated, resulting in a large increase in iron loss.

In order to overcome this problem, the Japanese Examined Patent Application Publication No. 52-24499 teaches a method in which the surface of the steel sheet is subjected to chemical polishing or electrolytic polishing to form a specular surface, and the surface of the steel sheet is further thinly metal-plated. The method aims to suppress an increase in iron loss by preventing the oxidation of the surface of the steel sheet and by preventing the deterioration of the surface smoothness of the steel sheet during coating and baking of the insulating coating film.

However, when metal plating had tension, the insulating coating film was likely to be peeled off by baking treatment. Even if the insulating coating film avoided being peeled off, since the insulating coating film was an ordinary phosphate non-tensile insulating coating film, reduction in iron loss was small.

When metal plating did not have a tensile effect, the iron loss reduction was very small. Moreover, even if a phosphate non-tensile insulating coating film was intended to be formed, the adhesion of the coating film was not satisfactory, and it was not possible to reduce iron loss.

Japanese Unexamined Patent Application Publication No. 62-103374 discloses a method in which a mixed ultrathin layer of the matrix and a variety of oxides, borides, silicides, phosphides, or sulfides is formed on a steel sheet surface smoothed by polishing, and a baked insulating coating film is further formed thereon. This method provides excellent adhesion between the steel sheet and the insulation film. However, since the mixed ultrathin layer of the matrix is present, the iron loss reduction effect due to mirror finishing of the steel sheet surface disappears, resulting in a small reduction in iron loss.

Japanese Unexamined Patent Application Publication No. 2-243770 discloses a method in which a ceramic coating film is formed by a sol-gel process. However, in this method, since adhesion with the steel sheet is inferior, it is not possible to provide a satisfactory tension-applying effect to the steel sheet, resulting in a small reduction in iron loss.

Japanese Examined Patent Application Publication No. 56-4150 discloses a method in which a steel sheet surface is smoothed by chemical polishing or electrolytic polishing so as to have a centerline mean roughness (Ra) of 0.4 μm or less, and a ceramic thin film is further formed thereon. However, since the ceramic thin film having satisfactory adhesion is formed by vacuum deposition, a large apparatus are required. The deposition rate is also low, and this method is not suitable for industrial production.

Japanese Unexamined Patent Application Publication Nos. 3-47957, 3-294465, 3-294466, 3-294467, 3-294468, 3-294469, and 3-294470 disclose methods in which coating films of oxides or silicides are formed by low pressure plasma spraying on the surfaces of smoothed matrices or the surfaces of metal-plated films formed thereon. Japanese Unexamined Patent Application Publication No. 10-245667 discloses a method in which tensile coating films composed of oxides, nitrides, or carbides are formed by plasma spraying. In these methods, although industrially acceptable deposition rates are ensured, since film formation is performed by droplet deposition, it is not possible to form dense films.

Moreover, the coating films have rough surfaces, and peeling occurs easily by friction. Furthermore, adhesion between the surfaces of the steel sheets or plated surfaces and the oxide or silicide coating films is not satisfactory. Therefore, a reduction in iron loss is insufficient. Similarly to vacuum deposition, large-scale pressure reducing apparatuses are required.

As described above, in recent techniques for reducing iron loss of grain-oriented magnetic steel sheets, it is absolutely necessary to form a tensile coating film on the steel sheet surface after smoothing the steel sheet surface during finishing annealing or in the subsequent treatment and/or after crystal orientation-intensifying treatment is performed. However, since the tensile coating film applies strong tension to the steel sheet surface, strong shearing stress is applied to the interface between the steel sheet surface and the tensile coating film, and the coating film is easily peeled off. As a result, tension application cannot be achieved, resulting in an insufficient reduction in iron loss.

Accordingly, various ideas have been adopted in order to secure adhesion of tensile coating films. However, when the adhesion was satisfactory, the iron loss reduction effect by smoothing of the steel sheet surface was lost.

Furthermore, when crystal orientation-intensifying treatment is performed to the steel sheet surface, the adhesion of the tensile coating film is slightly eased compared to smoothing treatment. However, in such a case, the adhesion is still far from the desired level, and the steel sheet did not have a sufficient tensile effect, and the reduction in iron loss was not satisfactory.

That is, the recent techniques for reducing iron loss of grain-oriented magnetic steel sheets have not been industrially used yet.

The present invention advantageously solves the problems described above. That is, it is an object of the present invention to provide a method for producing a grain-oriented magnetic steel sheet in which the surface of the steel sheet is subjected to smoothing treatment or crystal orientation-intensifying treatment and tension is applied to the steel sheet by a tensile coating film so as to greatly reduce iron loss and in which tensile force is sufficiently acted on the steel sheet without impairing the adhesion of the tensile coating film. It is another object of the present invention to provide a grain-oriented magnetic steel sheet having extremely low iron loss obtained by the method.

DISCLOSURE OF INVENTION

The development of the present invention will be described below.

The present inventors have carefully investigated the cause of the peel-off of the materials formed by conventional low pressure plasma spraying or the materials formed by ordinary plasma spraying. The following results have been obtained.

a) The coating material formed, i.e., coating film, is not a dense, single layer and has a structure in which particulate substances stick to each other in sequence, resulting in voids between particles. Such a structure is formed due to droplet spraying.

b) The coating film is easily peeled off because of such a structure. This is because cracking may start to occur from the voids in the coating film and the oxidation of the surface of the steel sheet through the voids may cause the peel-off of the coating film. The irregularities of the surface also accelerate the peel-off of the coating material.

The voids are produced between individual particles because droplets in a semi-molten state are jetted onto the surface of the steel sheet, and flat particles which stick together in sequence are overlaid to form the coating film. So-called "cold joints" are formed between particles, resulting in a decrease in strength. Irregularities resulting from the individual particles remain in the outermost surface. Furthermore, the oxidation of the surface of the steel sheet through the voids between particles accelerates the peel-off of particles.

On the assumption that deposition of a coating material in a vapor phase might solve the problems described above, the present inventors investigated various coating film formation methods. In a vacuum deposition process and a vapor phase synthetic process, which are well-known vapor-phase processes, the reduction in iron loss was not satisfactory. On the other hand, in a thermal plasma vapor deposition process, in which a coating material is deposited in a plasma state, that is a kind of the vapor phase, iron loss was satisfactorily reduced. While a coating layer is deposited at a very low deposition rate in an atmosphere close to a vacuum in the former case, a coating layer is deposited at a high deposition rate in an atmospheric atmosphere or in a slightly reduced pressure atmosphere in the latter case. Under the latter conditions, it was considered that since a dense coating layer having a small porosity was formed with an appropriate thickness, adhesion was satisfactory, and thus a satisfactory reduction in iron loss was achieved. Moreover, in the latter process, since a large-scale vacuum chamber is not required and the deposition rate is high, industrial advantages are expected.

The present inventors have carried out investigations further and found more detailed conditions. That is, it has been found that by forming a coating layer with a mean thickness of not less than 0.01 $\mu$m and not more than 10 $\mu$m on a surface of the matrix of a steel sheet with a thickness of 0.27 mm or less by vapor deposition in a low oxidizing atmosphere with an oxygen partial pressure of less than 0.1 atm and a total pressure of 0.1 atm or more, a grain-oriented magnetic steel sheet having extremely low iron loss is produced. It has also been found that the coating layer formed is dense with a porosity of 10% or less and also has a smooth surface, satisfactory adhesion of the coating film is obtained, and a large reduction in iron loss is achieved. It has also been found that by performing magnetic domain-refining treatment before or after vapor deposition, a further reduction in iron loss is enabled, which is preferable.

With respect to small iron cores, since deterioration in iron loss due to shear strain after shearing process is a problem, in many cases, customers perform stress relief annealing. The stress relief annealing is usually performed at approximately 800° C. for approximately 3 hours. In some cases, the coated layers were not able to resist the stress relief annealing, and the coating layers were peeled off. As a result, tension was not applied to the steel sheets, and rather iron loss was made worse greatly. Further investigations have been carried out on this problem, and it has been newly found that by forming a coating film on one surface of the steel sheet by controlling the deposition rate in the range of not less than 0.02 nm/sec and not more than 50 nm/sec, it is possible to produce a grain-oriented magnetic steel sheet having excellent adhesion of the coating film and therefor extremely low iron loss even after stress relief annealing is performed.

It has also been found that by controlling the temperature of the magnetic steel sheet at 200° C. or more during vapor deposition, or by performing heat treatment to the steel sheet at 200° C. or more after vapor deposition, adhesion is further improved. It has been found that by using fine powder with an average particle size of 5 μm or less as a depositing material, the irregularities on the surface of the steel sheet are reduced, and further improvement in adhesion is expected.

The present invention has been achieved based on the findings described above.

That is, in one aspect of the present invention, a method for producing a grain-oriented magnetic steel sheet having extremely low iron loss includes the step of forming a coating layer on a surface of the matrix of a grain-oriented magnetic steel sheet having a thickness of 0.27 mm or less by vapor deposition in a low oxidizing atmosphere with an oxygen partial pressure ($Po_2$) of less than 0.1 atm and a total pressure of 0.1 atm or more. Preferably, the coating layer is composed of any one of a chalcogenide, a silicide, a boride, and a nitride, and the coating layer on one surface of the steel sheet has a mean thickness of not less than 0.01 μm and not more than 10 μM. Preferably, the vapor deposition is performed by a thermal plasma vapor deposition process, the temperature of the steel sheet is controlled at 200° C. or more during vapor deposition or after deposition, or fine powder with an average particle size of 5 μm or less is used as a depositing material. In order to extremely reduce the iron loss after stress relief annealing, preferably, the vapor deposition is performed at a deposition rate of not less than 0.02 nm/sec and not more than 50 nm/sec. Other iron loss-reducing treatment, such as smoothing treatment or crystal orientation-intensifying treatment to the surface of the steel sheet, or magnetic domain-refining treatment before or after vapor deposition may be further performed. In another aspect of the present invention, a grain-oriented magnetic steel sheet having extremely low iron loss with a thickness of 0.27 mm or less includes a coating layer formed by vapor deposition on a surface of the matrix of the steel sheet, the coating layer being composed of a material that has a smaller coefficient of thermal expansion than that of iron, the coating layer having a porosity of 10% or less, The coating layer having mean thickness for one surface of not less than 0.01 μm and not more than 10 μm, and the coating layer having a centerline mean roughness (Ra) of less than 0.5 μm. The magnetic domain-refining treatment may be performed to the steel sheet.

BEST MODE FOR CARRYING OUT THE INVENTION

The present invention will be specifically described below.

Vapor deposition must be performed on a surface of the matrix of a magnetic steel sheet. The reason for this is that satisfactory denseness and tension are imparted to a resulting coating layer by vapor deposition (thermal plasma vapor deposition) at a relatively high pressure in the vicinity of atmospheric pressure. Therefore, in the usual process, forsterite which has been formed is removed from the surface of the magnetic steel sheet, or a step of preliminarily preventing the formation of forsterite is employed.

The thickness of the grain-oriented magnetic steel sheet used is limited to 0.27 mm or less. The reason for this is that if the sheet thickness exceeds 0.27 mm, the tension-applying effect by a coating material is not satisfactorily exhibited.

Vapor deposition is performed, for example, by thermal plasma irradiation. In order to perform thermal plasma irradiation, a DC plasma generator or a DC-HF plasma generator is used.

Figure 1:
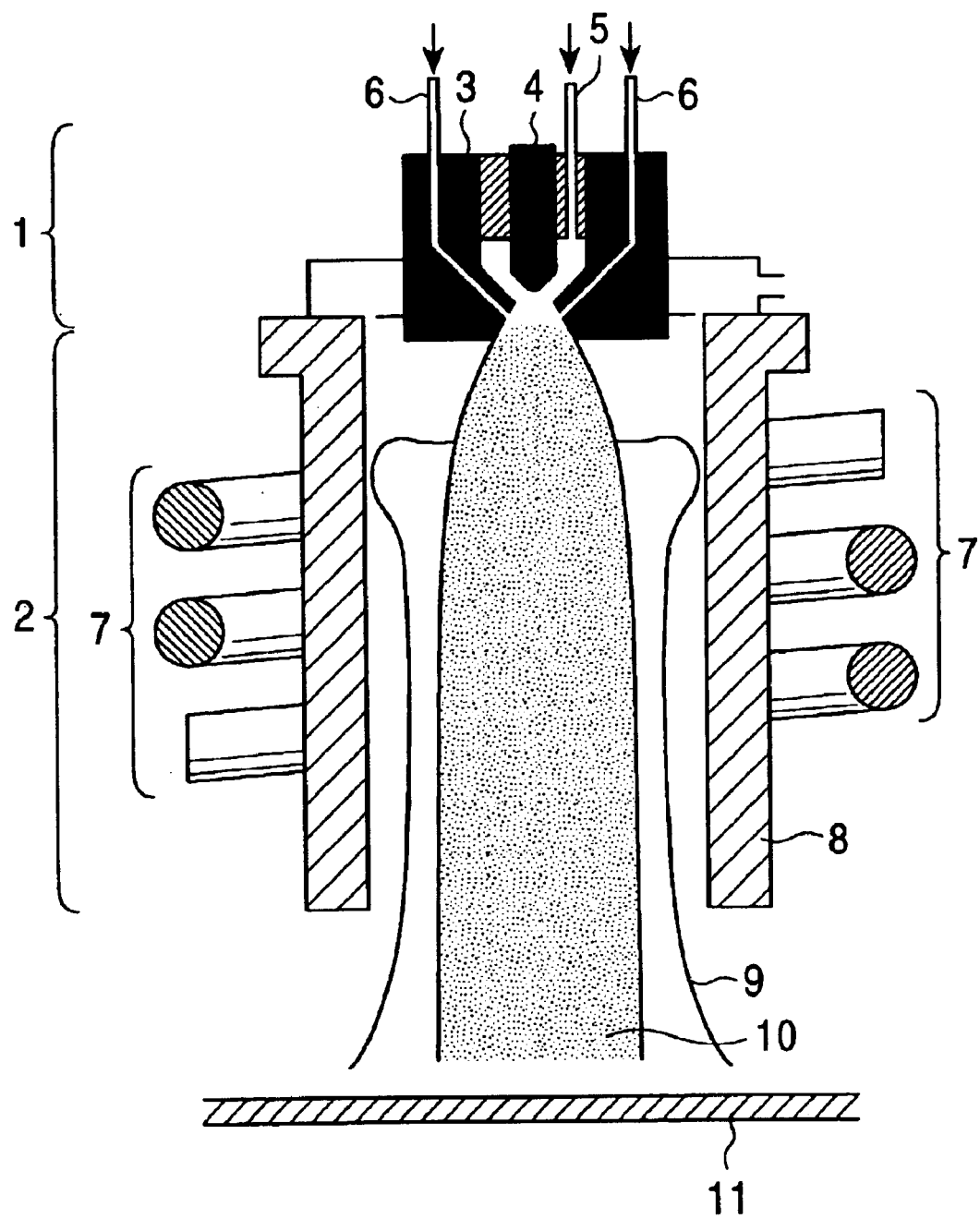
FIG. 1 is a sectional view which schematically shows a direct current and high frequency (DC-HF) hybrid plasma generator.

FIG. 1 is a sectional view which schematically shows a DC-HF plasma generator. An upper section 1 represents a DC plasma generating section, and a lower section 2 represents a HF plasma generating section. A plasma source gas is supplied from a pipe 5, or a carrier gas and a plasma source are supplied from pipes 6, to a gap between a positive electrode 3 and a negative electrode 4, and discharge heating is performed to generate a DC plasma. Furthermore, current is applied to a HF coil 7, and the DC plasma is focused in a heat-resistant container 8 to produce a plasma flame 10. The plasma flame is applied to the surface of a steel sheet 11 to form a coating layer. Additionally, the DC plasma may be directly applied to the steel sheet without passing through the HF plasma generating section. By placing a shield 9 around the plasma flame and the steel sheet, the plasma irradiation atmosphere can be controlled.

However, the vapor deposition method and apparatus are not limited to the example described above, and any method and apparatus which allow vapor deposition may be employed.

The irradiation atmosphere must be a low oxidizing atmosphere, such as an inert gas or a reducing gas, in order to prevent deterioration in adhesiveness and deterioration in iron loss due to the oxidation of the surface of the steel sheet. Specifically, it is important that the atmosphere has an oxygen partial pressure ($Po_2$) of less than 0.1 atm. As the atmospheric gas, a gas which does not contain carbon is preferable, and industrially, a nitrogen gas containing hydrogen is preferable.

With respect to the irradiation atmosphere, differing from the vacuum deposition process which is an often used vapor deposition process, the total pressure must be increased. The reason for this is that adhesion of the coating layer formed by the vapor deposition with the matrix and uniformity of the coating layer are improved, which is the major feature of the technique of the present invention. In order to improve adhesion and uniformity of the coating layer, the pressure during the vapor deposition is preferably 0.1 atm or more, and more preferably, 0.8 atm or more. Although the upper limit is not particularly set, the atmospheric pressure or a slightly pressurized atmosphere is desirable in view of maintaining the low oxidizing atmosphere.

Next, if the thickness of the coating layer formed by the vapor deposition is less than 0.01 μm, a sufficient tension-applying effect is not expected, and it is also difficult to make the surface of the steel sheet insulative and corrosion-resistant by stable coating. Therefore, the lower limit is set at 0.01 μm. On the other hand, if the thickness exceeds 10 μm, the lamination factor is decreased, and adhesiveness of the coating layer and smoothness of the surface deteriorate. Therefore, the upper limit is set at 10 μm.

When the steel sheet is subjected to stress relief annealing after working, preferably, the vapor deposition is performed at a deposition rate of not less than 0.02 nm/sec and not more than 50 nm/sec. If the deposition rate exceeds 50 nm/sec, the coating layer has insufficient denseness and adhesion between the coating layer and the matrix after stress relief annealing deteriorates. Furthermore, due to the peel-off of the coating layer, tension is not applied to the steel sheet, and satisfactory iron loss cannot be obtained. If the deposition rate is less than 0.02 nm/sec, it is not possible to prevent impurities which are present in trace amounts in the atmosphere from entering the space between the steel sheet and the coating layer. Consequently, adhesion between the coating layer and the matrix deteriorates after stress relief annealing, and iron loss deteriorates.

By controlling the temperature of the magnetic steel sheet at 200° C. or more during the vapor deposition, or by heating the steel sheet to 200° C. or more after the vapor deposition, adhesion of the coating layer can be improved. The reason for this is considered that although adhesion between the steel sheet and the coating layer deteriorates due to entering of impurities which are present in trace amounts in the atmosphere, the impurities are diffused by heating of the steel sheet and incorporated into the steel sheet or the coating layer.

As the source material for vapor deposition, powder with an average particle size of 5 $\mu$m or less is desirably used. If fine powder is used, it is possible to produce a depositing material in a completely vapor phase, a dense, rigid coating layer can be formed stably.

As a result, a coating layer having a porosity of 10% or less and having a smooth surface with a centerline mean roughness (Ra) of less than 0.5 $\mu$m can be obtained, and the peal-off thereof can be effectively prevented.

Herein, the composition of the coating layer is not particularly defined. However, a chalcogenide, a silicide, a boride, a carbide, a nitride, or the like is preferably acceptable. Chalcogenides is a generic term for element compounds of any of 5 elements, i.e., O, S, Se, Te, and Po, of group IV and are represented by oxides and sulfides.

Preferably, the surface of the steel sheet is subjected to smoothing treatment and crystal orientation-intensifying treatment before the vapor deposition in order to reduce iron loss.

Additionally, a tensile coating film or an insulating coating film may be further formed after the vapor deposition as required. Specific examples of coating film formation methods, which are acceptable, include known methods of forming insulating coating films using phosphates and chromates, methods of coating and baking a phosphate or a mixture of a phosphate and silica as disclosed in Japanese Unexamined Patent Application Publication No. 48-39338 or 50-79442, and a method of forming an alumina borate coating film disclosed in Japanese Unexamined Patent Application Publication No. 6-65754.

Furthermore, preferably, magnetic domain-refining treatment is performed by introducing grooves or local strain before or after the vapor deposition. Consequently, the tension-applying effect by the coating layer is more effectively exhibited.

EXAMPLE 1

(a) A grain-oriented magnetic steel sheet having a thickness of 0.22 mm in which linear grooves were formed in the width direction for the magnetic domain-refining purpose and then secondary recrystallization annealing was performed was prepared as a material. The forsterite coating film of the steel sheet was removed by acid pickling. Furthermore, smoothing treatment was performed using a mixed solution of sulfuric acid and chromic acid until the mean surface roughness of the steel sheet became approximately 0.10 $\mu$m. Next, while heating the steel sheet at 300° C., alumina was vapor-deposited by a DC thermal plasma vapor deposition process in a mixed atmosphere of 75% nitrogen and 25% hydrogen with 0.9 atm. As the deposition starting material, $Al_2O_3$ with an average particle size of 2 $\mu$m was used, and vapor deposition was performed so that the coating layer had a thickness of 5 $\mu$m per one side. The oxygen partial pressure ($Po_2$) in the atmosphere was controlled to 0.01 atm or less. The coating layer formed on the steel sheet had a porosity of 4% and a surface roughness (Ra) of 0.22 $\mu$m. Additionally, the porosity of the coating layer was calculated based on the bulk density relative to the theoretical density.

With respect to the steel sheet thus obtained, the adhesion of the coating film and magnetic characteristics were evaluated. In order to evaluate adhesion, the steel sheet was bent around a series of cylinders having decreasing diameters and measured the lowest cylinder diameter (minimum peel-off bending diameter) that produced no peel-off as a result of bending the steel sheet around the cylinder. As the measured value was decreased, the adhesion of the coating layer was evaluated as more satisfactory. Magnetic characteristics were evaluated by the Epstein method.

The evaluation results were as follows: minimum peel-off bending diameter=20 mm, $B_8$=1.902 T, and iron loss $W_{17/50}$=0.59 W/kg.

(b) Using a separator in which 0.3 wt % of $PbCl_2$ was added into MgO as the annealing separator, the formation of a forsterite coating film was inhibited, and a grain-oriented magnetic steel sheet with a thickness of 0.25 mm was produced. Magnetic domain-refining treatment was performed by secondary recrystallization while forming linear fine crystal grains with an appropriate distance therebetween in the width direction of the steel sheet. Next, silica was vapor deposited on the steel sheet by a HF-DC hybrid thermal plasma deposition process in an Ar atmosphere with 1.05 atm. As the deposition starting material, $SiO_2$ with an average particle size of 1.6 $\mu$m was used, and vapor deposition was performed so that the coating layer had a thickness of 0.8 $\mu$m per one side. The oxygen partial pressure ($Po_2$) in the atmosphere was controlled to 0.012 atm. The coating layer formed on the surface of the steel sheet had a porosity of 6% and a surface roughness (Ra) of 0.35 $\mu$m. A tensile coating solution mainly composed of 60% colloidal silica and 40% magnesium phosphate was applied to the surface of the steel sheet, baking was performed at 800° C. to form a tensile coating film. With respect to the steel sheet thus obtained, the adhesion of the coating layer and magnetic characteristics were evaluated in the same manner as that in (a).

The evaluation results were as follows: minimum peel-off bending diameter=25 mm, $B_8$=1.920 T, and iron loss $W_{17/50}$=0.63 W/kg.

(c) A grain-oriented magnetic steel sheet having a thickness of 0.22 mm in which linear grooves were formed in the width direction for the magnetic domain-refining purpose and then secondary recrystallization annealing was performed was prepared as a material. The forsterite coating film of the steel sheet was removed by acid pickling. Furthermore, smoothing treatment was performed using a mixed solution of sulfuric acid and chromic acid until the mean surface roughness of the steel sheet became approximately 0.10 $\mu$m. Next, while heating the steel sheet at 300° C., alumina was spray fixed by an ordinary plasma spraying process in a mixed atmosphere of 75% nitrogen and 25% of hydrogen with 0.9 atm. As the spray starting material, $Al_2O_3$ in a droplet state with an average particle size of 7 μm was used, and spraying was performed so that the coating layer had a thickness of 5 μm. The coating layer thus formed on the steel sheet had a porosity of 29% and a surface roughness (Ra) of 1.4 μm. With respect to the steel sheet thus obtained, the adhesion of the coating layer and magnetic characteristics were evaluated in the same manner as that in (a).

The evaluation results were as follows: minimum peel-off bending diameter=60 mm, $B_8$=1.888 T, and iron loss $W_{17/50}$=0.77 W/kg.

(a) and (b) correspond to the present invention, and (c) corresponds to a comparative example. Obviously, the magnetic steel sheets according to the present invention have satisfactory adhesion of the coating layers, low iron loss, and high magnetic flux densities.

EXAMPLE 2

Figure 2:
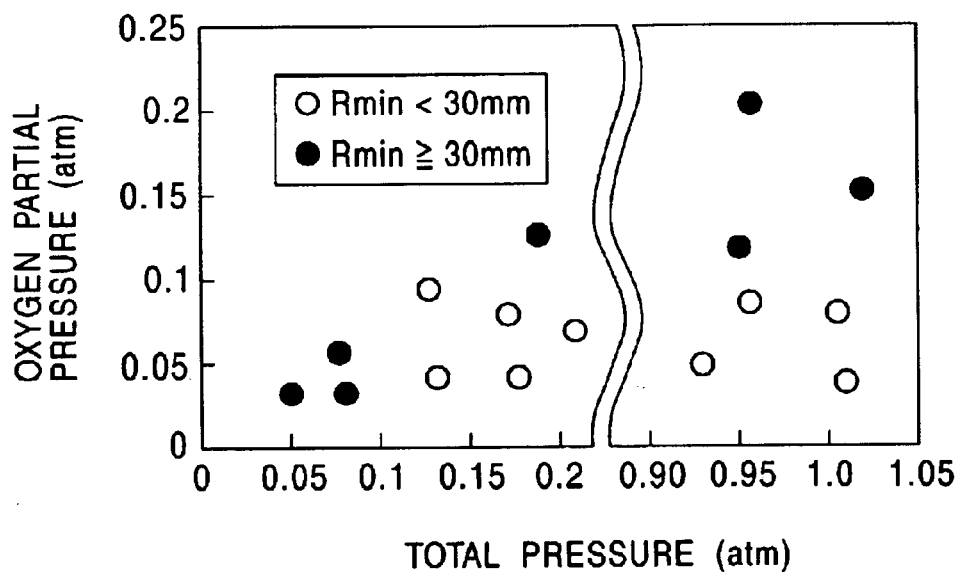
FIG. 2 is a graph which shows the influences of the total pressure and the oxygen partial pressure of a plasma irradiation atmosphere on the adhesion of coating films.
Figure 3:
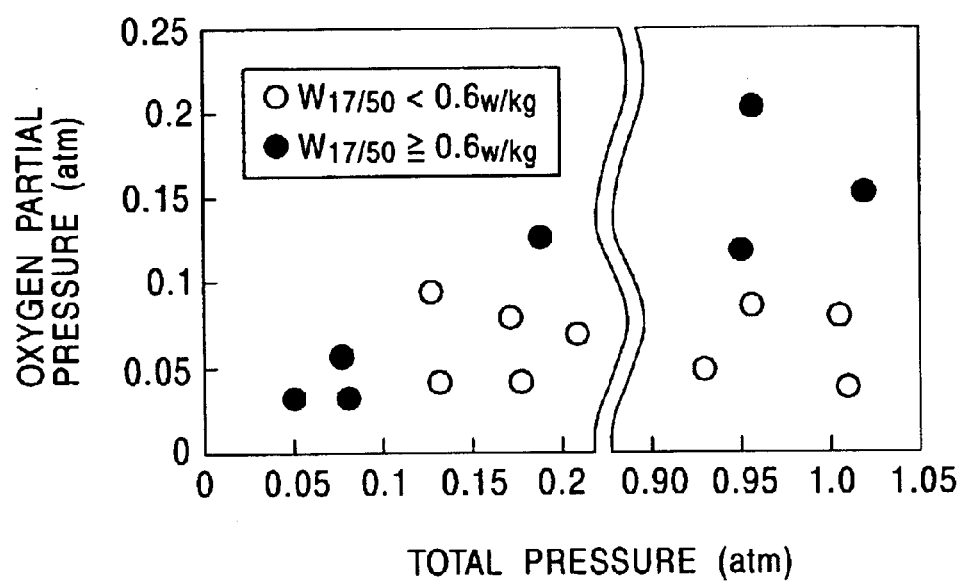
FIG. 3 is a graph which shows the influences of the total pressure and the oxygen partial pressure of a plasma irradiation atmosphere on iron loss.

Using alumina as the annealing separator, the formation of a forsterite coating film was inhibited, and secondary recrystallization annealing was performed. A grain-oriented magnetic steel sheet with a thickness of 0.18 mm was thereby produced. Next, while heating the steel sheet at 300° C., $Si_3N_4$ was vapor-deposited by a HF-DC hybrid thermal plasma vapor deposition process in a 100% nitrogen atmosphere. As the deposition starting material, $Si_3N_4$ powder having an average particle size of 1 μm was used, and vapor deposition was performed so that the coating layer had a thickness of 0.1 μm per one side. Vapor deposition was performed by varying the total pressure of the deposition atmosphere and the oxygen partial pressure. With respect to the steel sheets thus obtained, the adhesion of the coating layers and magnetic characteristics were measured in the same manner as that in Example 1. The measurement results of the adhesion of the coating layers are shown in FIG. 2. In the graph, a steel sheet with minimum peel-off bending diameter ($R_{min}$) of less than 30 mm is represented by ○ and one with minimum peel-off bending diameter ($R_{min}$) of 30 mm or more is represented by ●. The measurement results of magnetic characteristics are shown in FIG. 3. A steel sheet with iron loss $W_{17/50}$ of less than 0.60 W/kg is represented by ○ and one with iron loss $W_{17/50}$ of 0.60 W/kg is represented by ●. When the total pressure was 0.1 atm or more and the oxygen partial pressure was less than 0.1 atm, satisfactory adhesion of the coating layers and satisfactory magnetic characteristics were exhibited.

EXAMPLE 3

In order to refine magnetic domains, linear grooves were formed in the width direction of a cold-rolled sheet for a magnetic steel sheet and decarburizing annealing was performed. Then, in order to inhibit the formation of a forsterite coating film, an annealing separator composed of MgO incorporated with 1 wt % of magnesium chloride was applied to the steel sheet which had been subjected to decarburizing annealing, and secondary recrystallization annealing was performed. A grain-oriented magnetic steel sheet with a thickness of 0.21 mm was thereby produced. SiC films with various thicknesses were formed on the steel sheet by varying the deposition time by a HF-DC hybrid thermal plasma vapor deposition process in an Ar atmosphere with 1.0 atm. As the deposition starting material, SiC powder having an average particle size of 1 μm was used, and the oxygen partial pressure in the vapor deposition atmosphere was 0.001 atm. A tensile coating solution mainly composed of 55% colloidal silica, 40% magnesium phosphate, and 5% chromic acid was applied to the surface of each steel sheet, and baking was performed at 800° C. A tensile coating film with an areal weight of 8 g/m² was thereby formed.

With respect to the steel sheets thus obtained, the adhesion of the vapor-deposited films, magnetic characteristics of the steel sheets, and centerline mean roughness (Ra) were evaluated. The results are shown in Table 1. As is clear from the table, the magnetic steel sheets according to one aspect of the invention (film thickness is not less than 0.01 μm and not more than 10 μm) had satisfactory adhesion of the coating films and especially low iron loss.

TABLE 1

| | SiC Film Thickness (μm) | Minimum peel-off bending diameter (mm) | $B_8$ (T) | $W_{17/50}$ (W/Kg) | Ra (μm) | |
|---|---|---|---|---|---|---|
| 1 | 0.008 | 60 | 1.910 | 0.84 | 0.25 | Comparative Example* |
| 2 | 0.01 | 25 | 1.910 | 0.60 | 0.23 | Present Invention |
| 3 | 0.5 | 25 | 1.910 | 0.61 | 0.27 | Present Invention |
| 4 | 5.0 | 25 | 1.910 | 0.61 | 0.23 | Present Invention |
| 5 | 10 | 25 | 1.910 | 0.62 | 0.28 | Present Invention |
| 6 | 12 | 70 | 1.890 | 0.90 | 0.60 | Comparative Example* |

*To one aspect of present invention

EXAMPLE 4

In order to refine magnetic domains, linear grooves were formed in the width direction of a cold-rolled sheet for a magnetic steel sheet and then decarburizing annealing was performed. Then, in order to inhibit the formation of forsterite, an annealing separator composed of magnesia incorporated with 2% of magnesium chloride was applied to the steel sheet which had been subjected to decarburizing annealing, and then secondary recrystallization annealing was performed. A grain-oriented magnetic steel sheet with a thickness of 0.23 mm was thereby produced. Next, SiC coating films with a thickness of 0.07 μm for one surface were formed on both surfaces of the steel sheet by a HF-DC hybrid thermal plasma vapor deposition process in an argon atmosphere with 1.0 atm at various deposition rates shown in Table 2. The deposition rate was adjusted by changing the amount of the supplied SiC powder, which was the deposition starting material. A tensile coating solution mainly composed of 60% colloidal silica and 40% magnesium phosphate was applied to the surface of each steel sheet, baking was performed at 800° C. to form a tensile coating film. Furthermore, the grain-oriented magnetic steel sheet was subjected to stress relief annealing at 800° C. for 3 hours. With respect to the magnetic steel sheets thus obtained, the adhesion of the coating films and iron loss before and after stress relief annealing were evaluated. The evaluation results are shown in Table 2. As is clear from Table 2, at a deposition rate of 0.02 nm/sec to 50 nm/sec, adhesion and iron loss after stress relief annealing are satisfactory.

TABLE 2

| Deposition Rate (nm/sec) | Before Stress Relief Annealing | | After Stress Relief Annealing | |
|---|---|---|---|---|
| | Minimum peel-off bending diameter (mm) | $W_{17/50}$ (W/kg) | Minimum peel-off bending diameter (mm) | $W_{17/50}$ (W/kg) |
| 1  0.01 | 25 | 0.71 | 60 | 0.84 |
| 2  0.02 | 25 | 0.72 | 25 | 0.61 |
| 3  0.2  | 25 | 0.70 | 25 | 0.63 |
| 4  20   | 25 | 0.72 | 25 | 0.61 |
| 5  50   | 25 | 0.72 | 25 | 0.62 |
| 6  70   | 25 | 0.72 | 80 | 0.95 |

EXAMPLE 5

A forsterite coating film of a grain-oriented magnetic steel sheet having a thickness of 0.18 mm was removed by acid pickling, and the steel sheet was subjected to crystal orientation-intensifying treatment in which electrolytic polishing was performed in an aqueous NaCl solution. Then, $ZrO_2$ coating films with a thickness of 1.0 μm for one surface were formed on both surfaces of the steel sheet by a HF-DC hybrid thermal plasma vapor deposition process in a mixed atmosphere of hydrogen and nitrogen with 0.2 atm at various deposition rates shown in Table 3. The deposition rate was adjusted by changing the amount of the supplied $ZrO_2$ powder, which was the deposition starting material. Next, in order to refine magnetic domains, linear strain was applied to the steel sheet in the width direction by a gear. Furthermore, the grain-oriented magnetic steel sheet thus produced was subjected to stress relief annealing at 800° C. for 3 hours. With respect to the steel sheet thus obtained, the adhesion of the coating films and iron loss before and after stress relief annealing were evaluated. The evaluation results are shown in Table 3. As is clear from Table 3, at a deposition rate of 0.02 nm/sec to 50 nm/sec, adhesion and iron loss after stress relief annealing are satisfactory.

TABLE 3

| Deposition Rate (nm/sec) | Before Stress Relief Annealing | | After Stress Relief Annealing | |
|---|---|---|---|---|
| | Minimum peel-off bending diameter (mm) | $W_{17/50}$ (W/kg) | Minimum peel-off bending diameter (mm) | $W_{17/50}$ (W/kg) |
| 1  0.01 | 25 | 0.65 | 50 | 0.88 |
| 2  0.02 | 25 | 0.64 | 25 | 0.59 |
| 3  0.2  | 25 | 0.65 | 25 | 0.57 |
| 4  20   | 25 | 0.63 | 25 | 0.56 |
| 5  50   | 25 | 0.65 | 25 | 0.59 |
| 6  70   | 25 | 0.65 | 60 | 0.87 |

INDUSTRIAL APPLICABILITY

As described above, according to the present invention, it is possible to stably produce a grain-oriented magnetic steel sheet having greatly reduced iron loss compared with the conventional steel sheet, on the industrial scale, in which sufficient tension is imparted to the steel sheet by a tensile coating film having excellent adhesion. It is also possible to provide a grain-oriented magnetic steel sheet which has satisfactory characteristics even after stress relief annealing.

We claim:

1. A method for producing a grain-oriented magnetic steel sheet having extremely low iron loss comprising the step of forming a coating layer on a surface of the steel of a grain-oriented magnetic steel sheet having a thickness of 0.27 mm or less by vapor deposition in which a coating material is deposited in a plasma state by plasma irradiation applied to the steel surface, wherein the vapor deposition is conducted in a low oxidizing atmosphere with an oxygen partial pressure ($Po_2$) of less than 0.1 atm and a total pressure of 0.1 atm or more.

2. A method for producing a grain-oriented magnetic steel sheet according to claim 1, wherein the coating layer comprises any one of a chalcogenide, a silicide, a boride, and a nitride.

3. A method for producing a grain-oriented magnetic steel sheet according to claim 1, wherein the coating layer for one surface of the steel sheet has a mean thickness of not less than 0.01 μm and not more than 10 μm.

4. A method for producing a grain-oriented magnetic steel sheet according to claim 1, wherein the vapor deposition is performed at a deposition rate of not less than 0.02 nm/sec and not more than 50 nm/sec, and the grain-oriented magnetic steel sheet has extremely low iron loss after stress relief annealing.

5. A method for producing a grain-oriented magnetic steel sheet according to any one of claims 1 to 4, wherein the vapor deposition is performed by a thermal plasma vapor deposition process.

6. A method for producing a grain-oriented magnetic steel sheet according to any one of claims 1 to 4, wherein the vapor deposition is performed at a temperature of the steel sheet of 200° C. or more.

7. A method for producing a grain-oriented magnetic steel sheet according to any one of claims 1 to 4, further comprising the step of heat-treating the steel sheet at 200° C. or more after the vapor deposition.

8. A method for producing a grain-oriented magnetic steel sheet according to any one of claims 1 to 4, wherein fine powder with an average particle size of 5 μm or less is used as a depositing material.

9. A method for producing a grain-oriented magnetic steel sheet according to any one of claims 1 to 4, further comprising the step of performing smoothing treatment or crystal orientation-intensifying treatment to the surface of the steel sheet before the vapor deposition.

10. A method for producing a grain-oriented magnetic steel sheet according to any one of claims 1 to 4, further comprising the step of performing magnetic domain-refining treatment before or after the vapor deposition.

11. A method for producing a grain-oriented magnetic steel sheet according to any one of claims 1 to 4, further comprising the step of forming a tensile coating film and/or insulating coating film after the vapor deposition.

12. A method for producing a grain-oriented magnetic steel sheet according to any one of claims 1 to 4, wherein the low oxidizing atmosphere comprises a mixed atmosphere of nitrogen and hydrogen.

13. A grain-oriented magnetic steel sheet having extremely low iron loss with a thickness of 0.27 mm or less comprising a coating layer formed by vapor deposition on a surface of a steel sheet, wherein the coating layer comprises a material that has a smaller coefficient of the thermal expansion than that of iron, the coating layer has a porosity of 10% or less, the coating layer for one surface has a mean thickness of not less than 0.01 μm and not more than 10 μm, and the surface of the coating layer has a centerline mean roughness (Ra) of less than 0.5 μm.

14. A grain-oriented magnetic steel sheet according to claim 13, wherein magnetic domain-refining treatment is performed below the coating layer.

15. A grain-oriented magnetic steel sheet according to claim 13, wherein magnetic domain-refining treatment is performed in and below the coating layer.

16. A method for producing a grain-oriented magnetic steel sheet having extremely low iron loss comprising the step of forming a coating layer on a surface of the steel of a grain-oriented magnetic steel sheet having a thickness of 0.27 mm or less by vapor deposition in a low oxidizing atmosphere with an oxygen partial pressure ($Po_2$) of less than 0.1 atm and a total pressure of 0.1 atm or more; and stress relief annealing the steel sheet to produce an iron loss $W_{17/50}$ less than 0.6 W/kg.

17. A method for producing a grain-oriented magnetic steel sheet having extremely low iron loss comprising the step of forming a coating layer on a surface of the steel of a grain-oriented magnetic steel sheet having a thickness of 0.27 mm or less by vapor deposition in a low oxidizing atmosphere With an oxygen partial pressure ($Po_2$) of less than 0.1 atm and a total pressure of 0.1 atm or more, to produce a steel sheet having a minimum peel-off diameter of less than 30 mm.

18. A method for producing a grain-oriented magnetic steel sheet having extremely low iron loss comprising the step of forming a coating layer on a surface of the steel matrix of a grain-oriented magnetic steel sheet having a thickness of 0.27 mm or less by vapor deposition in a low oxidizing atmosphere with an oxygen partial pressure ($Po_2$) of less than 0.1 atm and a total pressure of 0.1 atm or more, wherein the vapor deposition comprises the step of vaporizing the coating layer substance.

* * * * *